(12) United States Patent
Takabayashi et al.

(10) Patent No.: US 6,172,878 B1
(45) Date of Patent: Jan. 9, 2001

(54) MULTI-ELEMENT MODULE AND PRODUCTION PROCESS THEREOF

(75) Inventors: Hiroshi Takabayashi, Atsugi; Masanori Takahashi, Chigasaki; Yasushi Shioya, Atsugi; Kenji Niibori, Hiratsuka, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/221,142

(22) Filed: Dec. 28, 1998

(30) Foreign Application Priority Data

Dec. 27, 1997 (JP) .................................................. 9-369099
Dec. 27, 1997 (JP) .................................................. 9-369100
Dec. 27, 1997 (JP) .................................................. 9-369101

(51) Int. Cl.[7] ............................................ H05K 1/14
(52) U.S. Cl. .................... 361/760; 361/763; 361/764; 361/765; 174/250; 174/260; 174/261; 228/180.21; 228/180.22
(58) Field of Search ................... 361/760, 763, 361/764, 765; 174/250, 260, 261; 439/66, 91; 349/58, 149; 228/180.21, 180.22

(56) References Cited

U.S. PATENT DOCUMENTS

| | | | |
|---|---|---|---|
| 5,019,944 | * 5/1991 | Ishii et al. ........................ | 361/783 |
| 5,213,715 | * 5/1993 | Patterson et al. ................. | 252/518 |
| 5,330,697 | * 7/1994 | Wong ................................ | 264/171 |
| 5,431,571 | * 7/1995 | Hanrahan et al. ................. | 439/91 |
| 5,543,949 | * 8/1996 | Machida et al. .................. | 359/75 |
| 5,571,866 | * 11/1996 | Nishida et al. .................... | 525/98 |
| 5,624,268 | * 4/1997 | Maeda et al. ..................... | 439/66 |
| 5,659,376 | 8/1997 | Uehara et al. .................... | 349/58 |
| 5,729,315 | 3/1998 | Takahashi et al. ................ | 349/149 |
| 5,751,386 | 5/1998 | Kanda et al. ..................... | 349/65 |
| 5,796,450 | 8/1998 | Kanda et al. ..................... | 349/65 |
| 5,838,412 | * 11/1998 | Ueda et al. ....................... | 349/150 |
| 5,847,795 | 12/1998 | Satoh et al. ...................... | 349/137 |

FOREIGN PATENT DOCUMENTS

| | | |
|---|---|---|
| 59-2179 | 1/1984 | (JP) . |
| 61-27902 | 6/1986 | (JP) . |

\* cited by examiner

*Primary Examiner*—Jeffrey Gaffin
*Assistant Examiner*—David Foster
(74) *Attorney, Agent, or Firm*—Fitzpatrick, Cella, Harper & Scinto

(57) ABSTRACT

A multi-element module is constituted by a substrate having thereon a plurality of first electrodes, a plurality of electrical elements each having at least one second electrode and disposed so that its second electrode is aligned with a first electrode in an opposed relationship, and an adhesive member disposed between the substrate and the plurality of electrical elements to ensure electrical connection between the first electrodes and the second electrodes. The adhesive member comprises an adhesive layer contacting and bonding the electrical elements to the substrate, and an anisotropic conductive layer comprising a resin and electroconductive particles dispersed in the resin. The anisotropic conductive film is disposed between the adhesive layer and the substrate so as to insulate adjacent electrodes from each other while electrically connects the first and second electrodes, even when the electrical elements having second electrodes different in thickness.

37 Claims, 11 Drawing Sheets

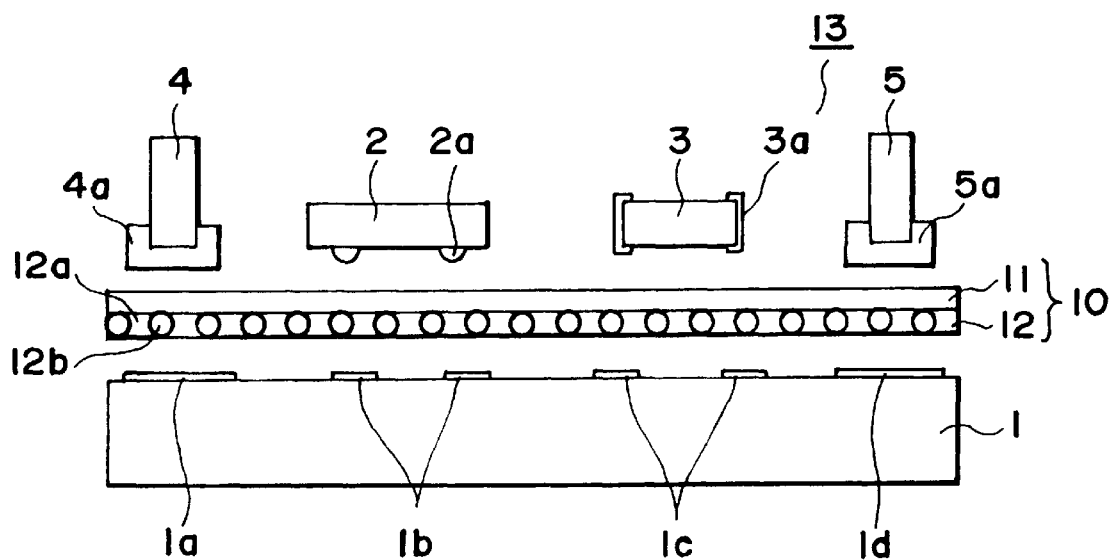
F I G. 2

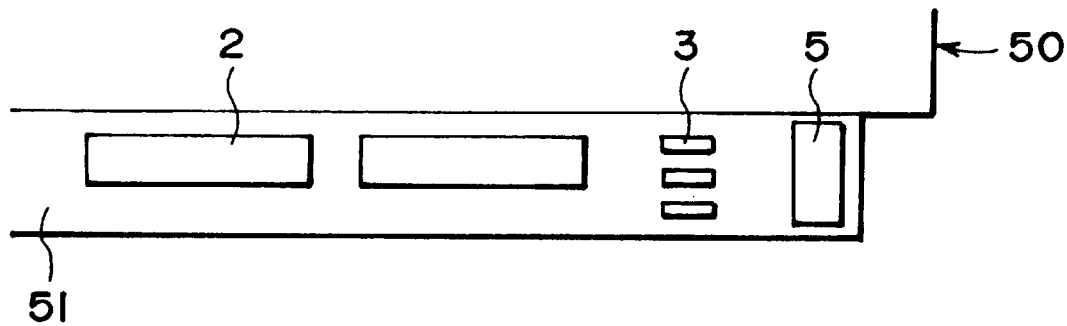
F I G. 5A
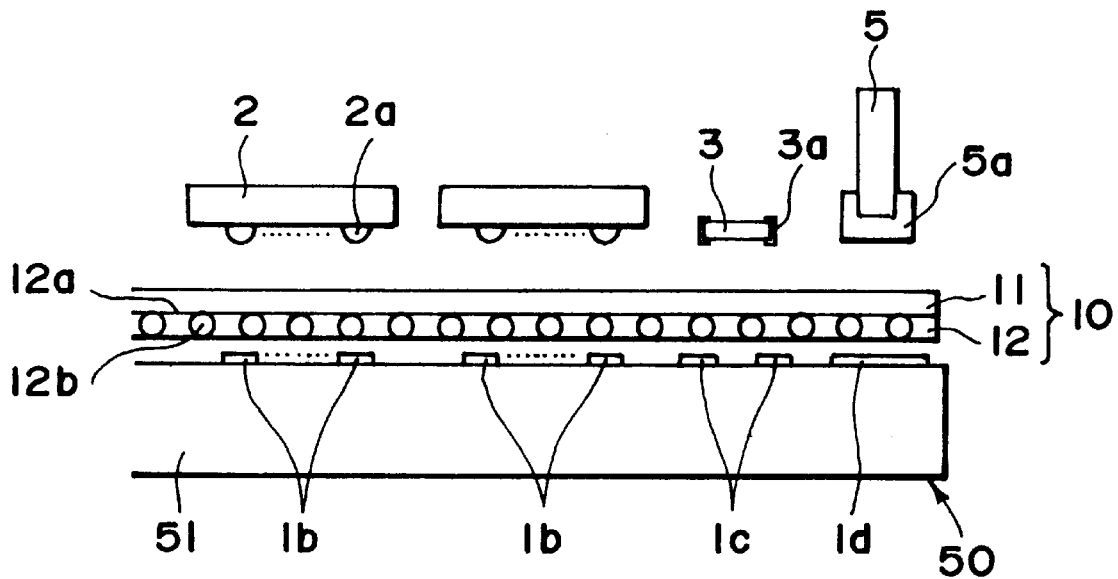
F I G. 5B

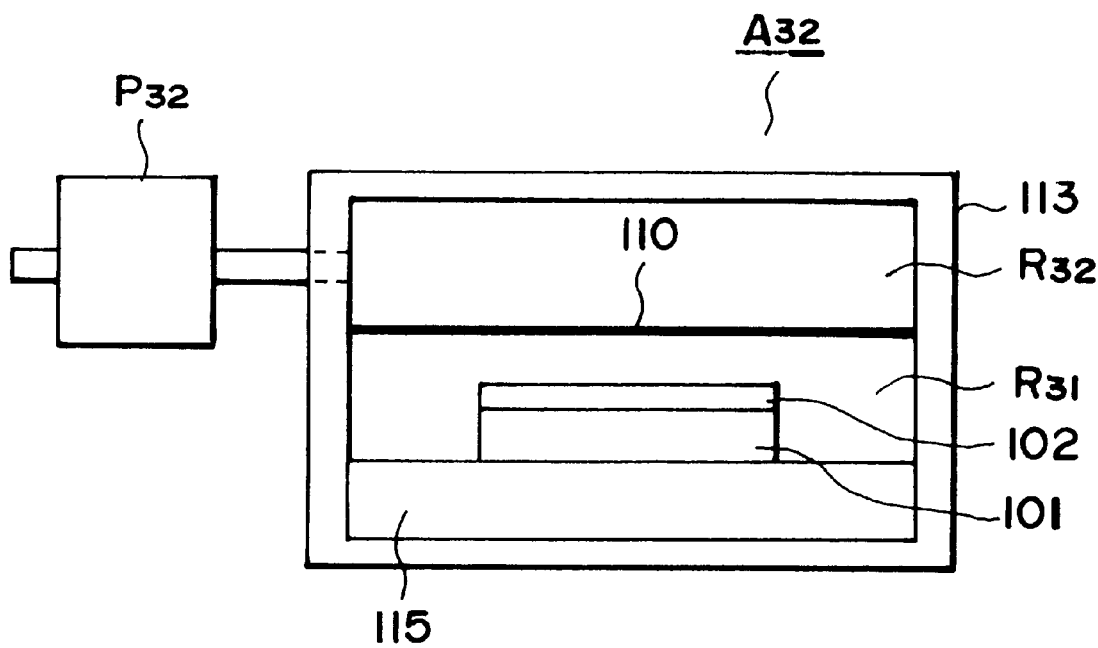
F I G. 11A
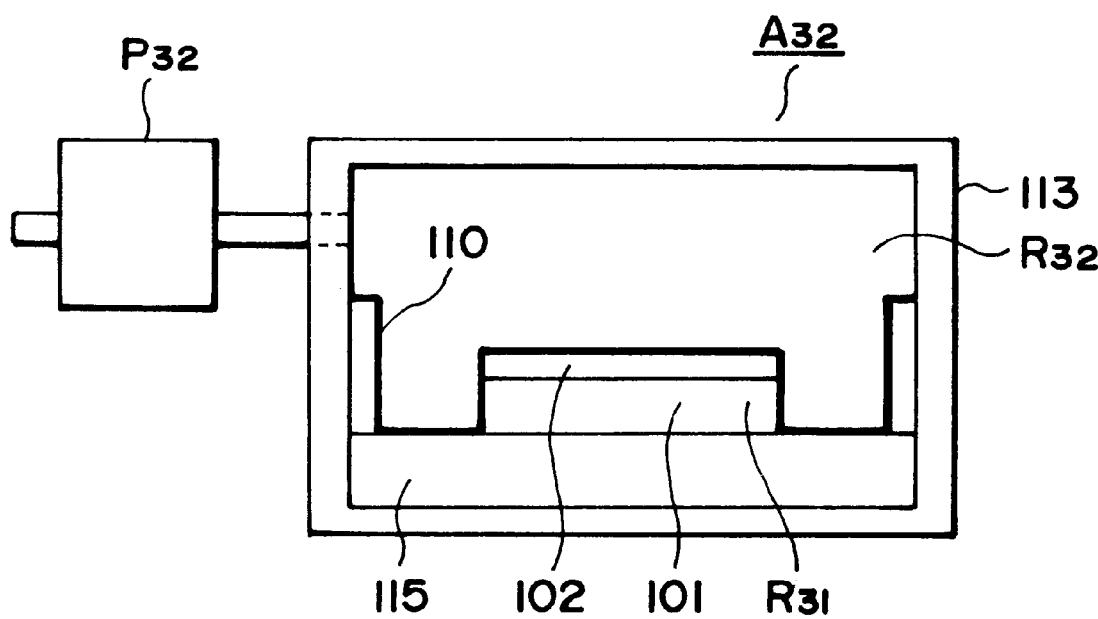
F I G. 11B

MULTI-ELEMENT MODULE AND PRODUCTION PROCESS THEREOF

FIELD OF THE INVENTION AND RELATED ART

The present invention relates to a multi-element module and a process for producing the multi-element module. The present invention also relates to an anisotropic conductive film-bonding apparatus for bonding an anisotropic conductive film having an anisotropic conductivity (i.e., a property of showing electroconductivity in a thickness direction and (electrically) insulating properties in a planar direction) to a substrate. The present invention further relates to an adhesive member for bonding two electrical elements or components to an adhesive member to each other while ensuring electrical connection between opposite electrodes provided to the two electrical components and a bonding method using the adhesive member.

There has been utilized solder or an anisotropic conductive adhesive (agent) as an adhesive member for bonding (different) two electrical components, thus ensuring electrical connection between electrodes of one of the electrical components and those of the other electrical component disposed to the (former) electrodes.

FIG. 1 is a schematic sectional view of an embodiment of a multi-element module includes a substrate 1 of, e.g., glass-epoxy or ceramics; a plurality of electrical elements including: a semiconductor device, such as an IC (integrated circuit) chip 2, a passive element 3 (e.g., (electrical) resistor or capacitor) and electro-mechanical elements 4 and 5 (e.g., connectors); and solder 6 for bonding these electrical elements 2, 3, 4 and 5 to the substrate 1 disposed therebetween.

The substrate 1 is provided with electrodes 1a, 1b, 1c and 1d thereon, and the electrical elements 2, 3, 4 and 5 are provided with electrodes 2a, 3a, 4a and 5a, respectively, so that each of the electrodes (e.g., 2a) is aligned with a corresponding electrodes (e.g., 1b) of the substrate 1 in an opposed relationship when bonded to each other by the solder 6.

On the other hand, as the adhesive member comprising an anisotropic conductive adhesive, there has been known an anisotropic conductive film comprising a resin and electro-conductive particles dispersed in the resin.

The anisotropic conductive film has an anisotropic conductivity, i.e., a property of ensuring electrical connection between opposite electrodes of different electrical components (e.g., the substrate 1 and the electrical elements 2–5) while retaining electrical insulation between adjacent electrodes for each electrical component (e.g., the substrate 1), thus being utilized as the adhesive member in various fields.

For instance, there have been proposed multi-element modules using the anisotropic conductive film in, e.g., Japanese Patent Publication Nos. (JP-B) 59-2179 and 61-27902.

Such an anisotropic conductive film is also utilized for electrical connection of a driver IC to a glass substrate of a liquid crystal display panel according to a TAB (tape automated bonding) scheme using a tape carrier or a COG (chip on glass) scheme.

These conventional adhesive members (solder and (known) anisotropic conductive film) are, however, accompanied with the following difficulties.

In the case of using the solder, (1) solder contains Pb and accordingly is required to be appropriately treated for its residue or waste so as to exclude adverse influences on environment, thus resulting in expensive treatment leading to an increase in production costs, (2) solder is required to use flux in order to activate surfaces at respective bonding points and also is liable to cause (fine) particles thereof (so-called solder balls), thus requiring an additional washing (cleaning) step for removing these flux and solder balls to result in a complicated production process and increased production costs, (3) it is necessary to coat solder with a resin (e.g., epoxy resin or silicone resin) in order to protect bonding points from moisture and dirt, thus requiring an additional step similarly as in the above (2), (4) adjacent solder portions are bonded to each other when electrodes are disposed in a small pitch of at most 0.3 mm, thus failing to ensure electrical insulation (isolation) between adjacent electrodes, and (5) defective products are liable to occur in a soldering step due to various causes, thus lowering a production yield.

In the case where the anisotropic conductive film described above is used instead of the solder 6 shown in FIG. 1 for bonding the electrodes 2a–5a having different thicknesses of the electrical elements 2–5 to the electrodes 1a–1d of the substrate 1, if the anisotropic conductive film used is too thin, bonding of the electrical element having a thicker electrode becomes insufficient, thus failing to ensure a reliability at the bonding portion.

On the other hand, if the anisotropic conductive film is too thick, an anisotropic conductivity (i.e., an electroconductive characteristic between opposite electrodes and an insulating characteristic between adjacent electrodes) thereof becomes insufficient, thus failing to ensure a desired (electrical) connection performance. Particularly, such a thicker anisotropic conductive film is not suitable for a connection structure requiring fine electrical connection. Accordingly, when driver ICs are electrically connected to a liquid crystal display device (panel) by using such an anisotropic conductive film, electrical elements other than the driver ICs (e.g., passive elements, such as resistor and capacitor and electromechanical elements, such as connectors) are not readily connected to the liquid crystal display device.

In a conventional bonding process of the anisotropic conductive film as described above, the anisotropic conductive film is first bonded to a substrate by using a heating and pressing means as shown in FIG. 7.

Referring to FIG. 7, an anisotropic conductive film 72 is disposed on a substrate 71 and a heating tool 73 having a pressing function is disposed opposite to (immediately over) the anisotropic conductive film 72.

For bonding operation, the heating (and pressing) tool 73 is moved downward to effect pressing and heating of the anisotropic conducive film 72, thus bonding the anisotropic conductive film 72 to the surface of the substrate 71.

Thereafter, by using the anisotropic conductive film 72 bonded to the substrate 71 surface, electrical elements (not shown) are bonded to the substrate 71 via the anisotropic conductive film 72.

In the conventional bonding process of the anisotropic conductive film 72 to the substrate 71 as shown in FIG. 7, however, the bonding process has encountered the following problems.

(i) In recent years, anisotropic conductive films used in multi-element modules or liquid crystal displays tend to have larger width and length for providing a largersized module or panel, thus requiring a larger heating tool 73. As a result, costs of equipment and production are correspondingly increased.

(ii) When a large-sized anisotropic conductive film 72 is contact-bonded by the heating tool 73, it is difficult to cause the entire pressing surface of the heating tool 73 to uniformly contact the entire surface of the anisotropic conductive film 72, thus being liable to leave air bubbles between the anisotropic conductive film 72 and the substrate 71, at which an adhesiveness between the anisotropic conductive film 72 and the substrate 71 becomes worse.

Incidentally, referring again to FIG. 1, soldering of electrical elements 2–5 onto the substrate 1 has been performed by various methods.

One of the methods is the use of a mounter (element-mounting apparatus) in combination with a substrate 1 to which surface an adhesive agent 7 is applied in advance as shown in FIG. 14. According to this method, electrical elements 2–5 mounted on the substrate 1 are bonded to the substrate by the adhesive agent 7 to effect bonding of the electrical elements 2–5 to the substrate 10.

According to this method, however, the use of the adhesive agent 7 is accompanied with a problem that it is difficult to ensure electrical insulation between adjacent electrodes when the electrodes are disposed in a small pitch of, e.g., at most 0.3 mm (the difficulty (4) in the case of solder described above). Further, in order to cure the adhesive agent 7, the mounter used is required to have a heating function, thus resulting in an expensive mounter.

Another method is the use of the mounter as described above in combination with (creamy) soldering paste 6 as shown in FIG. 15.

As shown in FIG. 15, similarly as in the above method (FIG. 14), electrical elements 2–5 mounted on a substrate 1 are bonded to each other by utilizing an adhesiveness of the solder 6.

According to this method, however, the use of the solder 6 is accompanied with the difficulties (1)–(5) as described above.

In the case of using the mounter in combination with the above-mentioned conventional anisotropic conductive film (having no room-temperature adhesive properties) instead of the adhesive agent 7 (FIG. 15) or the solder 6 (FIG. 15), bonding of the electrical elements 2–5 to the substrate 1 is performed via the anisotropic conductive film by pressing and heating the anisotropic conductive film while keeping the electrical elements 2–5 at prescribed positions on the substrate 1 by using the mounter, thus enhancing an adhesiveness of the anisotropic conductive film.

This method, however, is required to employ a special and expensive mounter allowing heating and pressing at the same time and an accurate bonding operation even under application of a necessary pressure (generally, 1–5 kgf/cm$^2$) at a prescribed temperature (generally, 80±10° C.), thus resulting in an increase in production costs.

Further, in the case of using a plurality of anisotropic conductive films to be bonded to the substrate 1, when the bonding of the anisotropic conductive films is performed under heating, it is necessary to effect positioning and heating for each anisotropic conductive film individually. In this case, one heating operation tables about 1–5 sec, thus prolonging a total bonding time for the plural anisotropic conductive films to lower productivity.

SUMMARY OF THE INVENTION

An object of the present invention is to provide a multi-element module and a production process thereof capable of suppressing an increase in production costs.

Another object of the present invention is to provide a multi-element module and a production process thereof allowing bonding of electrical elements even when their electrodes are arranged in a small pitch.

Another object of the present invention is to provide a multi-element module and a production process thereof capable of preventing a lowering in production yield.

Another object of the present invention is to provide a multi-element module and a production process thereof capable of ensuring both an adhesiveness to electrical elements and an anisotropic conductivity.

Another object of the present invention is to provide an anisotropic conductive film-bonding apparatus capable of reducing production costs.

Another object of the present invention is to provide an anisotropic conductive film-bonding apparatus capable of effecting uniform bonding.

Another object of the present invention is to provide an anisotropic conductive film-bonding apparatus capable of providing an inexpensive multi-element module and a liquid crystal display panel (device) showing a good adhesion quality.

Another object of the present invention is to provide an adhesive member capable of suppressing an increase in production costs.

Another object of the present invention is to provide an adhesive member allowing bonding of electrical elements even when their electrodes is disposed in a small pitch.

Another object of the present invention is to provide an adhesive member capable of preventing a lowering in production yield.

Another object of the present invention is to provide an adhesive member capable of ensuring both an adhesiveness to electrical elements and an anisotropic conductivity.

Another object of the present invention is to provide an adhesive member capable of providing a liquid crystal display device provided with different electrical elements including driver IC(S) and other electrical elements.

A further object of the present invention is to provide a multi-element module including the adhesive member as described above.

A still further object of the present invention is to provide a bonding method using the adhesive member as described above.

According to a first aspect of the present invention, there is provided a multi-element module, comprising:

a substrate having thereon a plurality of first electrodes, a plurality of electrical elements each having at least one second electrode and disposed so that its second electrode is aligned with a first electrode in an opposed relationship, and an adhesive member disposed between the substrate and the plurality of electrical elements to ensure electrical connection between the first electrodes and the second electrodes, wherein the adhesive member comprises an adhesive layer contacting and bonding the electrical elements to the substrate, and an anisotropic conductive layer comprising a resin and electroconductive particles dispersed in the resin and disposed between the adhesive layer and the substrate so as to insulate adjacent electrodes from each other while electrically connects the first and second electrodes.

The present invention also provides a process for producing a multi-element module including a substrate having thereon first electrodes, and electrical elements having second electrodes and bonded to the substrate via an adhesive layer and an anisotropic conductive layer while retaining electrical connection between the first and second electrodes disposed opposite to each other; said process comprising:

a step of applying an adhesive layer for effecting bonding between the substrate and the electrical elements onto the electrical elements, a step of applying onto the substrate an anisotropic conductive layer for insulating adjacent first electrodes from each other while electrically connects the first and second electrodes, and a step of superposing the adhesive layer on the anisotropic conductive layer so as to contact each other.

The present invention further provides a process for producing a multi-element module including a substrate having thereon first electrodes, and electrical elements having second electrodes and bonded to the substrate via an adhesive member comprising an adhesive layer and an anisotropic conductive layer while retaining electrical connection between the first and second electrodes disposed opposite to each other; said process comprising:

a step of bonding an adhesive member, which comprises at least an adhesive layer for bonding the substrate and the electrical elements to each other and an anisotropic conductive layer in lamination, to the substrate so that the anisotropic conductive layer contacts the substrate, and a step of bonding the electrical elements to the adhesive layer.

According to a second aspect of the present invention, there is provided an anisotropic conductive film-bonding apparatus for bonding to a substrate an anisotropic conductive film having electroconductive properties in its thickness direction and insulating properties in its planar direction, comprising:

a closed space in which a substrate and an anisotropic conductive film, having opposite surfaces, disposed on the substrate, and pressing means for pressing the anisotropic conductive film on the substrate by developing a differential pressure resulting from a difference in atmospheric pressure between one of the opposite surface contacting the substrate and the other surface of the anisotropic conductive film.

In the apparatus the closed space may be divided by a flexible member into two chambers including a chamber in which the anisotropic conductive film disposed on the substrate is disposed opposite to the flexible member, and the pressing means may preferably cause a differential pressure between the two chambers.

Specifically, the pressing means may be connected and supply high-pressure gas to the chamber in which the anisotropic conductive film is not disposed, or may comprise evacuation means connected to the chamber in which the anisotropic conductive film is disposed and from which air is evacuated.

Further, the closed space may be enclosed by a flexible tube member and connected to the pressing means by which air within the closed space is evacuated.

Further, the closed space is enclosed by a wall member a part of which includes a flexible member disposed opposite to the anisotropic conductive film disposed on the substrate.

According to a third aspect of the present invention, there is provided an adhesive member for bonding a first electrical component provided with first electrodes to a second electrical component provided with second electrodes disposed opposite to the first electrodes, comprising:

an adhesive layer having room-temperature adhesive properties for bonding first and second electrical components to each other, and an anisotropic conductive layer comprising a resin and electroconductive particles dispersed in the resin for ensuring electrical connection between opposite first and second electrodes while retaining electrical insulation between adjacent electrodes.

The present invention also provides a multi-element module, comprising:

a substrate having thereon a plurality of first electrodes, a plurality of electrical elements each having at least one second electrode and disposed so that its second electrode is aligned with a first electrode in an opposed relationship, and an adhesive member disposed between the substrate and the plurality of electrical elements to ensure electrical connection between the first electrodes and the second electrodes, wherein the adhesive member comprises an adhesive layer having room-temperature adhesive properties and contacting and bonding the electrical elements to the substrate, and an anisotropic conductive layer comprising a resin and electroconductive particles dispersed in the resin and disposed between the adhesive layer and the substrate so as to insulate adjacent electrodes from each other while electrically connects the first and second electrodes.

The present invention further provides a bonding method for bonding a substrate provided with first electrodes and electrical elements provided with second electrodes to each other so that the first electrodes and the second electrodes are disposed opposite to each other, said method comprising:

a step of disposing an anisotropic conductive layer on the substrate so as to cover the first electrodes and electrically connects opposite first and second electrodes with each other while insulates adjacent electrodes from each other, a step of disposing an adhesive layer having room-temperature adhesive properties on the anisotropic conductive layer or the second electrodes provided to the electrical elements, a step of superposing the electrical elements on the substrate so that the second electrodes are aligned with the first electrodes in an opposed relationship, and a step of heating and pressing the electrical elements and the substrate at bonding points therebetween.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic sectional view for illustrating a structure of the multi-element module, using an adhesive member, according to the present invention.

FIG. 5A is a schematic plan view of a part of a liquid crystal display panel (device) using the multi-element module of the present invention and FIG. 5B is a schematic sectional view of the liquid crystal display panel.

FIGS. 8, 9, 10A, 10B, 11A, 11B and 12 are respectively a schematic sectional view of an embodiment of the anisotropic conductive film-bonding apparatus according to the present invention.

DETAILED DESCRIPTION OF THE PREFERRED EMBODIMENTS

Figure 1:
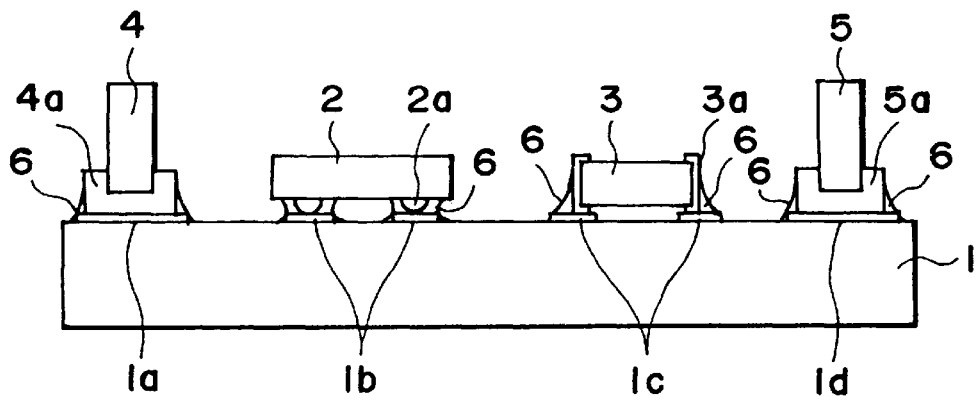
FIG. 1 is a schematic sectional view a structure of a multi-element module using solder.

Hereinbelow, the present invention will be specifically described on preferred first to third embodiments (according to the first to third aspect, respectively) based on the figures. Herein, identical reference numerals for respective structural members (or portions) in the figures are used for describing identical structural members to each other.

First Embodiment

According to the first aspect of the present invention, an adhesive member comprise an adhesive layer for bonding electrical elements to a substrate and an anisotropic conductive layer having thereon the adhesive layer and for electrically connecting electrodes of the electrical elements and those of the substrate opposite to each other while ensuring electrical insulation (isolation) between adjacent electrodes of the electrical elements and between those of the substrate.

FIG. 2 shows a structure of a multi-element module 13 of the present invention before bonding electrical elements 2–5 to a substrate 1.

Referring to FIG. 2, the multi-element module 13 includes the substrate 1 having thereon a plurality of electrodes 1a–1d, and the electrical elements 2–5 each having at least one electrode 2a–5a and disposed so that each electrode (e.g., 4a) of the electrical elements (e.g., 4) is aligned with a corresponding electrode (e.g., 1a) on the substrate 1 in an opposed relationship as shown in FIG. 2 similarly as in FIG. 1.

The multi-element module 13 also includes an adhesive member 10 including an anisotropic conductive layer 12 and an adhesive layer 11 disposed on the anisotropic conductive layer 12 and is disposed between the oppositely disposed electrical elements 2–5 and the substrate 1.

The adhesive layer 11 contacts and bonds the electrical elements 2–5 to the substrate 1 via the anisotropic conductive layer 12 under the adhesive layer 11, and the anisotropic conductive layer 12 formed by dispersing and incorporating electroconductive particles 12b in a resin 12a functions as an anisotropic conductive film allowing electrical connection between opposite electrodes (e.g., 1a and 4a, 1b and 2a, 1c and 3a, 1d and 5a, etc.) while keeping electrical insulation between adjacent electrodes (e.g., 1a and 1b, 1b and 1c, 1b and 1c, 1c and 1d, 4a and 2a, 2a and 3a, 3a and 5a, etc.), thus ensuring an anisotropic conductivity.

When the electrodes 2a–5a of the electrical elements 2–5 have different thicknesses from each other, in this embodiment, the adhesive member 10 may have a substantially uniform thickness over the entire surface of the substrate 1 while retaining at least a thickness corresponding to a maximum thickness of the electrodes 2a–5a different in thickness, thus ensuring a thickness of the adhesive member 10 being equal to or larger than the thicknesses of the electrodes 2a–5a at any bonding (adhesive) point over the substrate 1.

Further, the adhesive member 10 may have different thicknesses in different regions so long as at each bonding point the adhesive member 10 may be formed in a thickness equal to or larger than the corresponding electrode thickness of the electrical element bonded thereto.

Figure 3A:
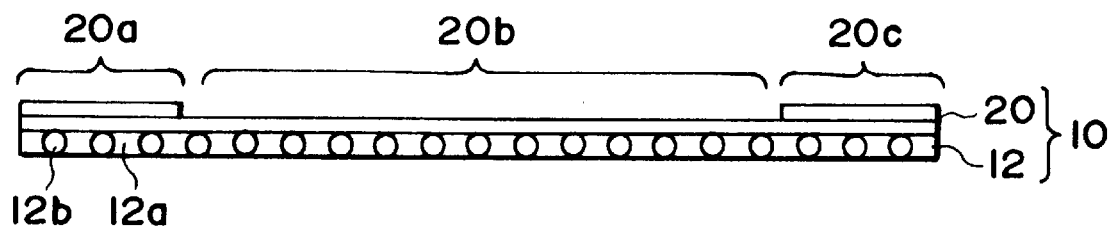
FIGS. 3A and 4A are respectively a schematic sectional view of another embodiment of an adhesive member used in the multi-element module of the present invention.
Figure 4A:
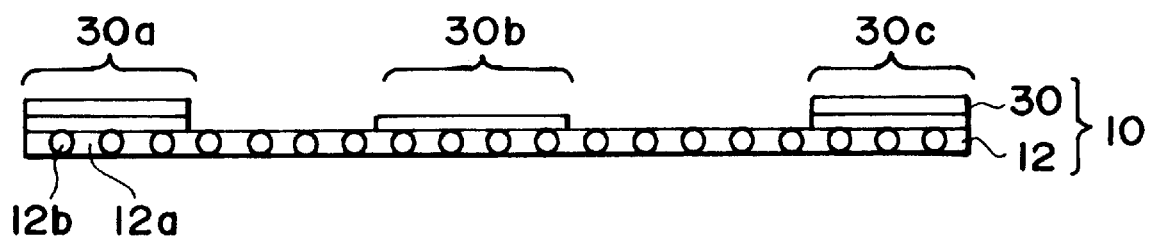
Figure 4B:
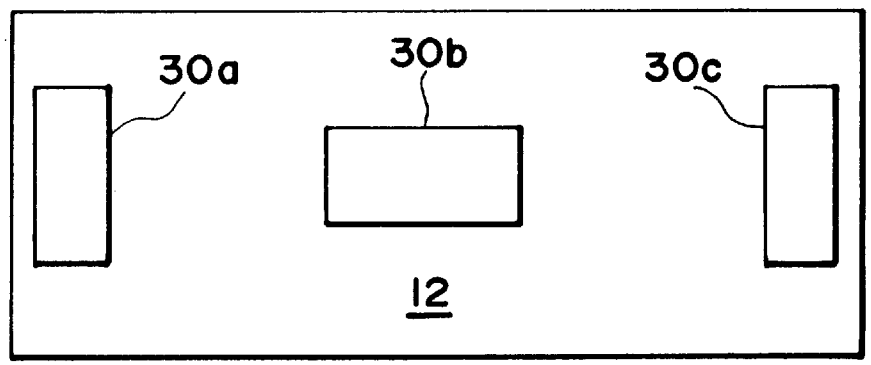

Specifically, when the electrodes 4a and 5a of the electrical elements 4 and 5 are thicker than those 2a and 3a of the electrical elements 2 and 3 (as shown in FIG. 2), as shown in FIGS. 3A (3B) and 4A (4B), an adhesive layer 20 or 30 of the adhesive member 10 may be formed in a two-layer structure in regions 20a and 20c or 30a and 30c, where the thicker electrodes 4a and 5a are disposed, depending upon the thicknesses of the electrodes 4a and 5a. On the other hand, in a region 20b or 30b where the thinner electrodes 2a and 3a are disposed, the adhesive layer 20 or 30 may be formed in a thickness so as to provide the adhesive member 10 with a thickness of at least that of the thinner electrodes 2a and 3a. Further, as shown in FIGS. 4A and 4B, in regions where no electrodes of the electrical elements 2–5 are disposed, the adhesive layer 30 may be omitted.

The substrate 1 to which the electrical element 2–5 are bonded with the adhesive member 10 (comprising the adhesive layer 11 and the anisotropic conductive layer 12) as shown in FIG. 2 may be used as a component of a liquid crystal display panel or device.

Specifically, as shown in FIGS. 5A and 5B, a liquid crystal display panel 50 includes a glass substrate 51 having thereon electrodes 1a–1d and electrical elements 2–5 having electrodes 2a–5a, respectively, disposed on and bonded to the glass substrate 51 via the adhesive member 10.

Then, the production process of the multi-element module described above will be explained with reference to FIGS. 5A and 5B.

Referring to the figures, the above-mentioned adhesive member 10 is bonded to the substrate 51 provided with the electrodes 1a–1d so that the anisotropic conductive layer 12 of the adhesive member 10 contacts the substrate 51.

Then, positioning of the opposite electrodes is effected so as to align the electrodes 2a–5a of the electrical elements 2–5 with the electrodes 1a –1d in an opposed relationship, followed by bonding of the electrical element 2–5 to the adhesive layer 11 of the adhesive member 10.

Thereafter, thermocompression (heating and pressing) is performed to complete bonding of the electrical elements 2–5 to the glass substrate 51 via the adhesive member 10 while ensuring electrical connection between the opposite electrodes (e.g., 1b and 2a, 1c and 3a, 1d and 5a) and keeping electrical insulation between adjacent electrodes (e.g., 2a and 3a, 3a and 5a, 1b and 1c, 1c and 1d), thus preparing a multi-element module according to the present invention.

Another production process of the multi-element module of the present invention will be described with reference to FIG. 6.

First, adhesive layers 40a, 40b, 40b and 40c are applied to the electrical elements 4, 2, 3 and 5 via the electrodes 4a, 2a, 3a and 5a, respectively, while an adhesive conductive layer 12 is applied to the substrate 1 via the electrodes 1a–1d.

Then, the electrodes 1a–1d of the substrate 1 and those 4a, 2a, 3a and 5a of the electrical elements 4, 2, 3 and 5 are positionally aligned so as to be opposite to each other, respectively, followed by superposition of the electrical elements 2–5 on the substrate 1.

Thereafter, by effecting thermocompression of the electrical elements 2–5 and the substrate 1 via the adhesive layers 40a–40c and the anisotropic conductive layer 12, it is possible to complete bonding of the electrical elements 2–5 to the substrate 1 while electrically connecting the opposite electrodes (e.g., 1a and 4a, 1b and 2a) and electrically isolating adjacent electrodes (e.g., 4a and 2a, 1a and 1b).

According to this embodiment in accordance with the first aspect of the present invention, the boning of the electrical elements 2–5 to the substrate 1 is performed by using the adhesive member 10 (including the adhesive layer 11 and the anisotropic conductive layer 12), thus avoiding the use of the solder (as the adhesive agent) resulting in the above-mentioned difficulties (1)–(5).

In this embodiment, the adhesive member 10 is formed in a lamination structure wherein the adhesive layer for bonding the electrical elements 2–5 to the substrate 1 is disposed on the anisotropic conductive layer 12, comprising the resin 12a and the electroconductive particles 12b dispersed in the resin 12a, for ensuring an electroconductive state between the opposite electrodes and an electrically insulating state between the adjacent electrodes.

By using the adhesive member 10 having such a lamination structure, even when a plurality of electrical elements 2–5 having electrodes 2a–5a different in thickness are bonded to the substrate 1 provided with the electrodes 1a–1d, it is possible to realize an adhesiveness of the electrical elements 2–5 together with an anisotropic conductivity (electroconductivity in a thickness direction and insulating properties in a planar direction of the multi-element module) through an appropriate selection of, e.g., a particle size of the electroconductive particles 12b, species and properties of the resin 12a, depending on, e.g., the materials of the electrical elements and the thicknesses of the electrodes.

Accordingly, by using the multi-element module as described above, it is possible to provide a liquid crystal display device compatible provide with different electrical elements including driver IC(s) and other electrical elements (e.g., semiconductor devices such as controller ICs, passive elements such as resistor and capacitor, and electro-mechanical elements such as connectors) (i.e., so-called "system on panel").

In other words, according to this embodiment, it is possible to provide a multi-element module and a system on panel with high reliability by an inexpensive production process.

Further, in the case of bonding the electrical elements having different electrode thicknesses to the substrate via the adhesive member having a substantially uniform thickness over the entire surface of the substrate, it is possible to reduce production costs while retaining good adhesive properties with respect to the electrical elements.

In a specific example of this embodiment, the adhesive layers 11, 20, 30 and 40a–40d may, e.g., be formed in a film by applying onto release paper a mixture of 30 wt. parts of acrylic rubber, 60 wt. parts of epoxy resin, 9.5 wt. parts of polyvinyl phenol, 0.5 wt. part of undecyl imidazole resin and 100 wt. parts of methyl ethyl ketone (MEK), followed by drying thereof.

The anisotropic conductive layer 12 may, e.g., by formed in a 8 $\mu$m-thick film (anisotropic conductive film) by uniformly dispersing electroconductive particles comprising 5 $\mu$m$\phi$-epoxy resin particles surface-coated with Ni—Au alloy in the adhesive layers (11, 20, 30, 40a–40d) at a density of $10^6$ (particles)/mm$^3$.

The materials and thicknesses of the adhesive layer and the anisotropic conductive layer may appropriately be selected in view of the materials of the electrical elements and the thickness of the electrodes of the electrical elements.

Hereinbelow, this embodiment will be described more specifically based on some specific preferred examples with reference to the drawings.

Figure 15:
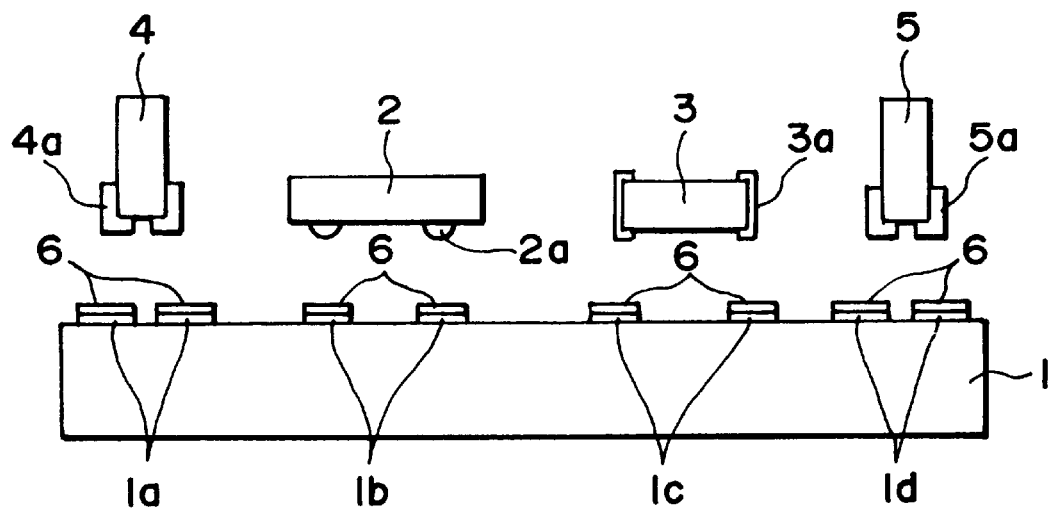
Figure 16:
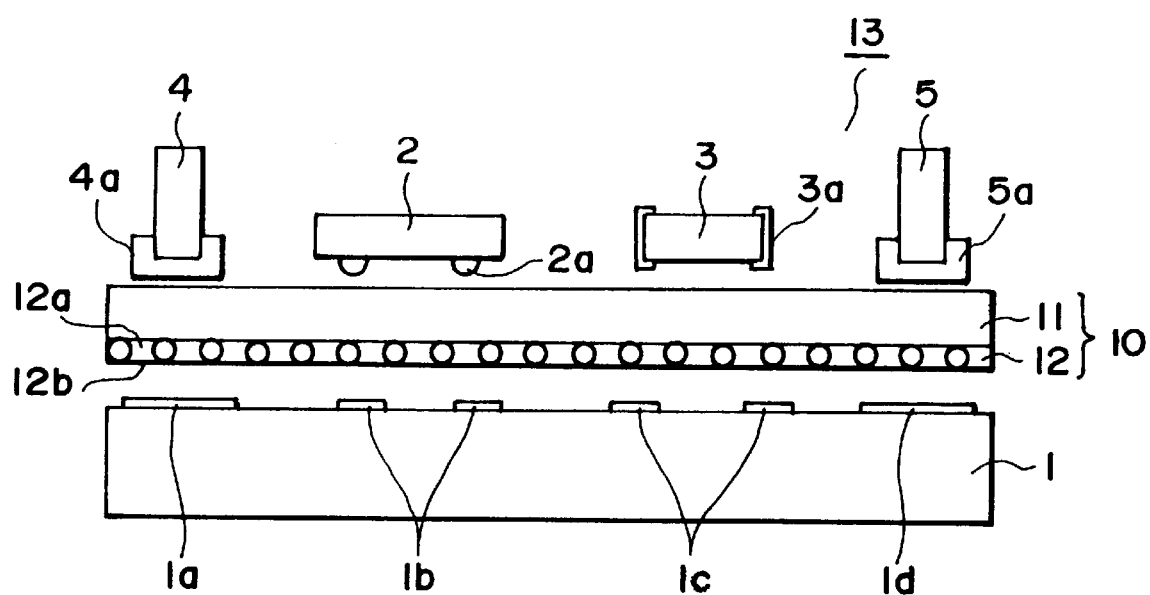
FIG. 16 is a schematic sectional view for illustrating an embodiment of the bonding method according to the present invention.

As a first specific example, a liquid crystal display panel 50 using a multi-element module 13 including electrical elements 2–5 (such as driver IC, controller IC, resistor, capacitor and connectors) bonded to a glass substrate 1 or 51 via an adhesive member 10 comprising an anisotropic conductive layer 12 and an adhesive layer 11 disposed thereof, as shown in FIGS. 15 and 16 is prepared.

The adhesive member 10 is comprised of a 147 $\mu$m-thick adhesive layer 11 and a 8 $\mu$m-thick anisotropic conductive layer 12 in lamination.

The adhesive layer 11 and the anisotropic conductive layer 12 are prepared in the above-mentioned manner.

The thus prepared adhesive member 10 has a substantially uniform thickness of 155 $\mu$m which was larger than that (150 $\mu$m) of lead frame electrodes being the thickest electrode for the electrical elements 2–5.

Then, the adhesive member 10 is bonded to the substrate 51 (for the liquid crystal display panel 50) so that the anisotropic conductive layer 12 contacts and covers transparent electrodes 1a–1d (a film of ITO (indium tin oxide) in a thickness of at most 0.1 $\mu$m) formed on the substrate 51.

Thereafter, the electrical elements 2–5 provided with electrodes 2a–5a, respectively, different in thickness are mounted on the adhesive layer 11 of the adhesive member 10 so that the electrodes 4a, 2a, 3a and 5a are aligned with the transparent electrodes 1a, 1b, 1c and 1d in an opposed relationship, respectively, followed by thermocompression (heating and pressing) to prepare a multi-element module as a part of a liquid crystal display panel while ensuring electrical connection between the opposite electrodes (e.g., 4a and 1a, 2a an 1b) and electrical insulation between the adjacent electrodes (e.g., 2a and 3a, 1a and 1b).

According to this specific example, it is possible to effectively bond the various electrical elements 2–5 having different electrode thicknesses to the glass substrate 51, thus ensuring good adhesive properties with respect to the various electrical elements 2–5.

Figure 3B:
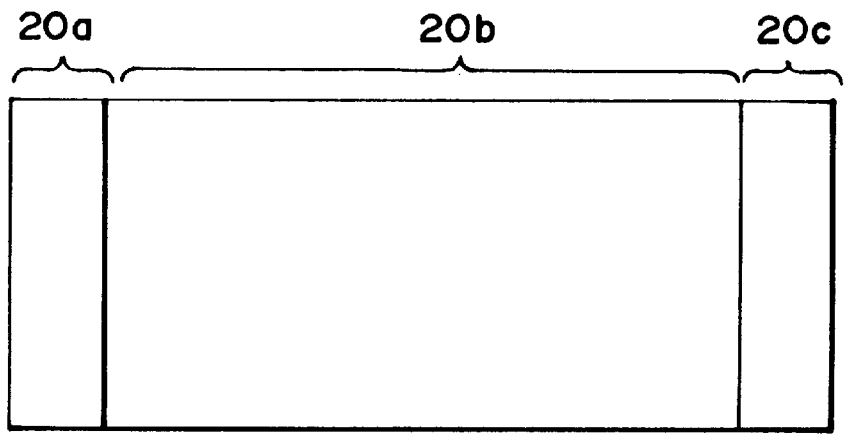
FIGS. 3B and 4B are schematic plan views of the adhesive-members shown in FIGS. 3A and 4A, respectively.

As a second specific example, a liquid crystal display panel 50 shown in FIG. 15 is prepared by using a multi-element module including an adhesive member 10 (shown in FIGS. 3A and 3B) is prepared in the same manner as in the first specific example described above except that the adhesive layer 11 is changed to an adhesive layer 20 having a partial lamination structure as shown in FIG. 3A.

As shown in FIG. 3A, the adhesive member 10 is comprised of an anisotropic conductive layer 12 (the same as in the first specific example) and a partial lamination-type adhesive layer 20 including a single layer portion in a region 20b and the two-layer portions in regions 20a and 20c. The adhesive member 10 having such a structure is prepared by lamination of the adhesive layer 20 and the anisotropic conductive layer 12 through a reel-to-reel scheme using a continuous sheet.

Thickness (μm) of the adhesive layer 20 in the regions 20a–20c are determined based on the following equation (A):

$$t21+t3 \approx t1+t7+\alpha \tag{A}$$

wherein, t21: thickness (μm) of the anisotropic conductive layer 12,
t3: thickness (μm) of the adhesive layer 20,
t1: thickness (μm) of the electrodes 1a–1d on the substrate side,
t7: thickness (μm) of the electrodes 2a–5a on the electrical element side, and
α: 0–10 μm, preferably about 5 μm, determined in view of an amount of removal of the adhesive layer 20 and a sealing effect with respect to the electrical elements 2–5.

The thickness t1 of the electrodes 1a–1d of the substrate 1 (51) is at most 0.1 μm (which was thin enough compared with other electrodes 2a–5a) for ITO electrodes of a liquid crystal display panel 50 and accordingly can be disregarded.

The thickness t7 of the electrodes 2a–5a of the electrical elements 2–5 vary depending on the species thereof and are set in this example to ca. 15 μm for bump electrodes of semiconductor devices 2 (e.g., driver ICs), 25 μm for electrodes of passive elements 3 (e.g., resistor and capacitor), and 150 μm for lead frame electrodes of electromechanical elements 4 and 5 (e.g., connectors).

The thickness t21 of the anisotropic conductive layer 12 is set to 8 μm.

The thickness t3 of the adhesive layer 20 is changed for each bonding region in view of the electrode thicknesses t7 of the electrical elements 2–5. Specifically, the thickness t3 of the adhesive layer 20 is set to 12 μm in a bonding region for the semiconductor devices 2, 22 μm in a bonding region for the passive elements 3 and 147 μm in a bonding region for the electro-mechanical elements 4 and 5, thus ensuring a relationship for all the bonding regions such that the thickness of the adhesive layer 20 is at least that of the electrode of the electrical element concerned.

According to this (second) specific example, it is possible to realize a good adhesive state of the electrical elements 2–5 to the substrate 1 (51) even when the thickness of the electrodes 2a–5a for the electrical elements 2–5 were considerably different from each other, while retaining the anisotropic conductivity of the anisotropic conductive layer 12.

Further, the liquid crystal display panel is produced through a conventional production process so that it is not necessary to modify largely a production apparatus and production steps with respect to a conventional anisotropic conductive film, while attaining a high reliability and a good productivity.

As a third specific example, a liquid crystal display panel using an adhesive member 10 having a discrete-structured adhesive layer 30 as shown in FIGS. 4A and 4B is prepared in the same manner as in the second specific example except that the layer structure of the adhesive layer 20 (FIG. 3A) is changed to that of the adhesive layer 30 as shown in FIG. 4A while holding the relationship between the thickness of the adhesive member 10 and the electrodes 2a–5a of the electrical element 2–5 set in the second specific example.

In this (third) specific example, different from the adhesive layer 20 used in the second specific example, the adhesive layer 30 is not formed partially on the substrate 1 in a region (other than regions 30a–30c) where the electrical element 2–5 are not mounted.

The adhesive layer 30 has a single layer structure in a region 30b where the electrical element 2 and 3 having thinner electrodes 2a and 3a are mounted, and a two-layer structure in regions 30a and 30b where the electrical elements 4 and 5 having thicker electrodes 4a and 5a are mounted.

According to this (third) specific example, it is possible to achieve the effects similarly as in the second specific example. Further, it is possible to decrease the amount of the adhesive layer material, thus reducing production costs.

As a fourth specific example, a multi-element module is produced in the following manner.

Figure 6:
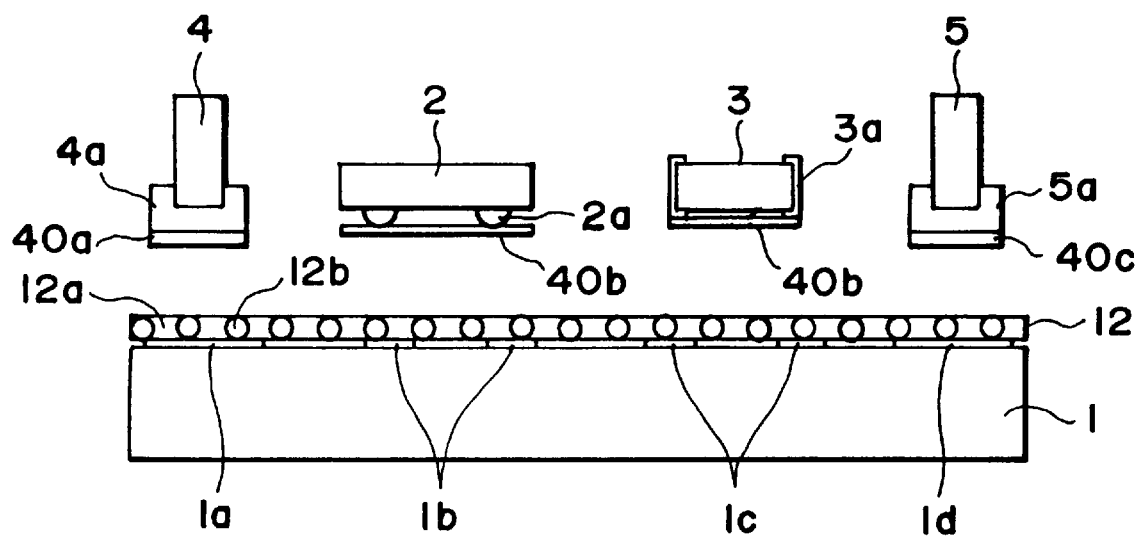
FIG. 6 is a schematic sectional view for illustrating an embodiment of the process for producing a multi-element module according to the present invention.
Figure 7:
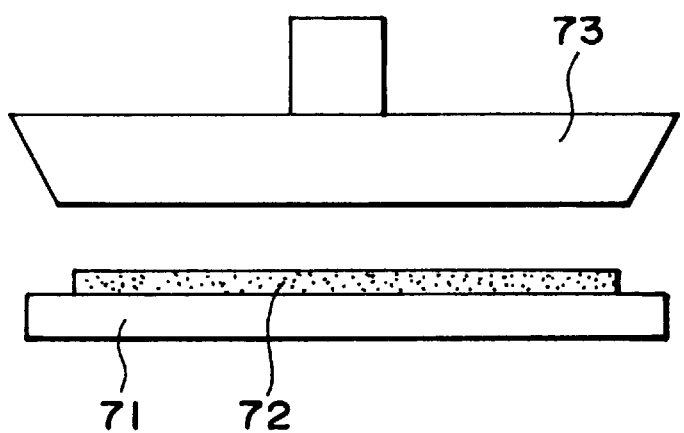
FIG. 7 is a schematic plan view for explaining a conventional method of bonding an anisotropic conductive film to a substrate.

As shown in FIG. 6, onto electrical elements 2–5 having electrodes 2a–5a (the same as in the second specific example), adhesive layers 40b, 40a and 40c are applied, respectively, so as to satisfy the following thickness relationship.

| Element | Electrode thickness | Thickness of adhesive layer |
|---|---|---|
| 2 | (2a)  15 μm | (40b)  12 μm |
| 3 | (3a)  25 μm | (40b)  22 μm |
| 4 | (4a) 150 μm | (40a) 147 μm |
| 5 | (5a) 150 μm | (40a) 147 μm |

Separately, a 8 μm-thick anisotropic conductive layer 12 (the same as in the first specific example) was applied onto a (glass) substrate 1 so as to occur electrodes (ITO) 1a–1d.

Then, the electrical elements 2–5 are superposed on the substrate 1 while effecting positioning of the respective electrical elements 2–5 so that the adhesive layers 40a–40c contact the anisotropic conductive layer 12, followed by heating and pressing the resultant structure, thus completing bonding of the electrical elements 2–5 to the substrate 1 while ensuring the electrical connection between the opposite electrodes and electrical insulation between the adjacent electrodes.

According to this (fourth) specific example, it is possible to effect bonding of the electrical elements 2–5 to the substrate 1 by using a small amount of the adhesive layer material while retaining a good adhesion state.

Second Embodiment

According to the second aspect of the present invention, there is provided an anisotropic conductive film-bonding apparatus for bonding an anisotropic conducive film having an anisotropic conductivity (electroconductive properties in its thickness direction and electrically insulating properties in its planar direction) to a substrate.

A second embodiment according to the second aspect of the present invention will be described hereinbelow with reference to FIGS. 8–12.

Figure 8:
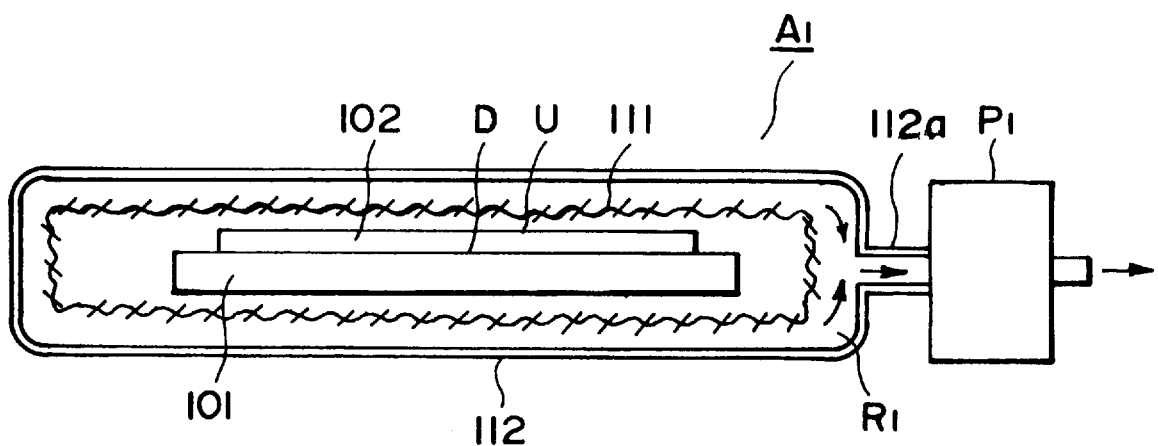

FIG. 8 shows an example of the anisotropic conductive film-bonding apparatus $A_1$ of the present invention for bonding an anisotropic conductive film 102 to a substrate 101.

Referring to FIG. 8, the apparatus $A_1$ includes a closed space $R_1$ enclosed by a flexible tube member 112 (e.g., resin film such as polyester film), an air-permeable member 111 (e.g., nonwoven fabric) disposed within the closed space $R_1$ and enclosing the anisotropic conductive film 102 disposed on the substrate 101, and a pressing means $P_1$ (e.g., a vacuum pump) for developing a differential pressure resulting from a difference in atmospheric pressure between a surface D contacting the substrate 101 and a surface U opposite to the surface D of the anisotropic conductive film 102.

The pressing means $P_1$ is connected to the closed space $R_1$ via an opening portion 112b of the flexible tube member 112. When the pressing means $P_1$ (e.g., the vacuum pump) is actuated, air within the closed space $R_1$ (defined by the flexible tube member 112) is evacuated therefrom via the air-permeable member 111 to the outside, thus bonding the anisotropic conductive film 102 to the substrate 101.

The air-permeable member 111 may be disposed at least between the anisotropic conductive film 102 and the opposite portion of the tube member 112 so as to allow uniform pressing of the anisotropic conductive film 102 on the substrate 101.

FIGS. 9–12 illustrates other examples of the anisotropic conducive film-bonding apparatus of the present invention.

Figure 9:
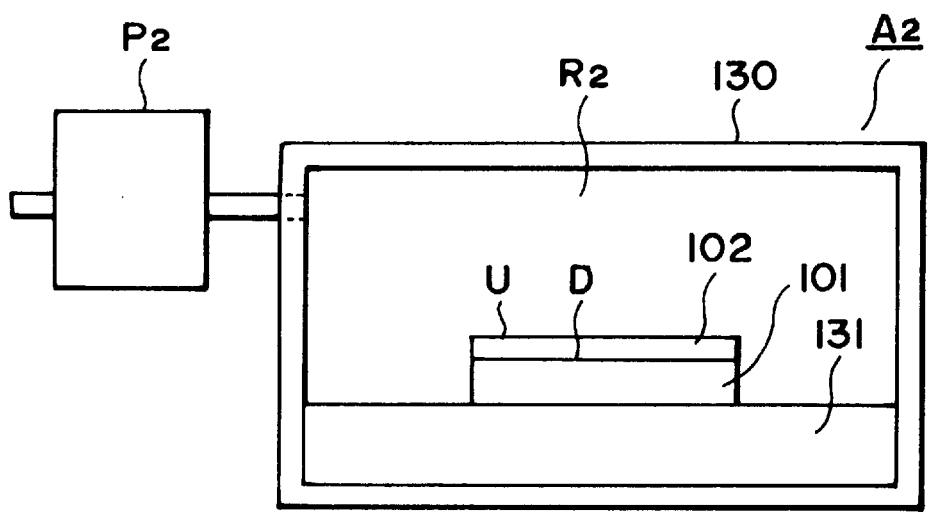

An anisotropic conductive film-bonding apparatus $A_2$ shown in FIG. 9 includes a closed space $R_2$ enclosed by a closed chamber 130 (e.g., an inflexible (rigid) member) and a gas-feeding (supplying) means $P_2$ (e.g., a pump) as the pressing means. The gas-feeding means $P_2$ is actuated to supply a high-pressure gas into the closed space $R_2$ so that the surface U not contacting the substrate 101 of the anisotropic conductive film 102 is supplied with a pressure higher than that at the surface D contacting the substrate 101 of the anisotropic conductive film 102.

In this case, the anisotropic conductive film 102 disposed on the substrate 101 may be heated by a heating member 131 (e.g., a heater block) disposed under the substrate 101. Further, the high-pressure gas supplied to the closed space may be heated in advance, thus effectively heating the anisotropic conductive film 102.

In anisotropic conductive film-bonding apparatus $A_{31}$ and $A_{32}$ shown in FIGS. 10A and 10B and FIGS. 11A and 11B, respectively, the closed space is divided by a flexible member 110 (e.g., a rubber sheet) into two chambers including an upper chamber $R_{32}$ and a lower chamber $R_{31}$ wherein the anisotropic conductive film 102 and the substrate 101 are disposed on a heating member 115 so that the anisotropic conductive film 102 and the flexible member 110 and disposed opposite to each other.

Figure 10A:
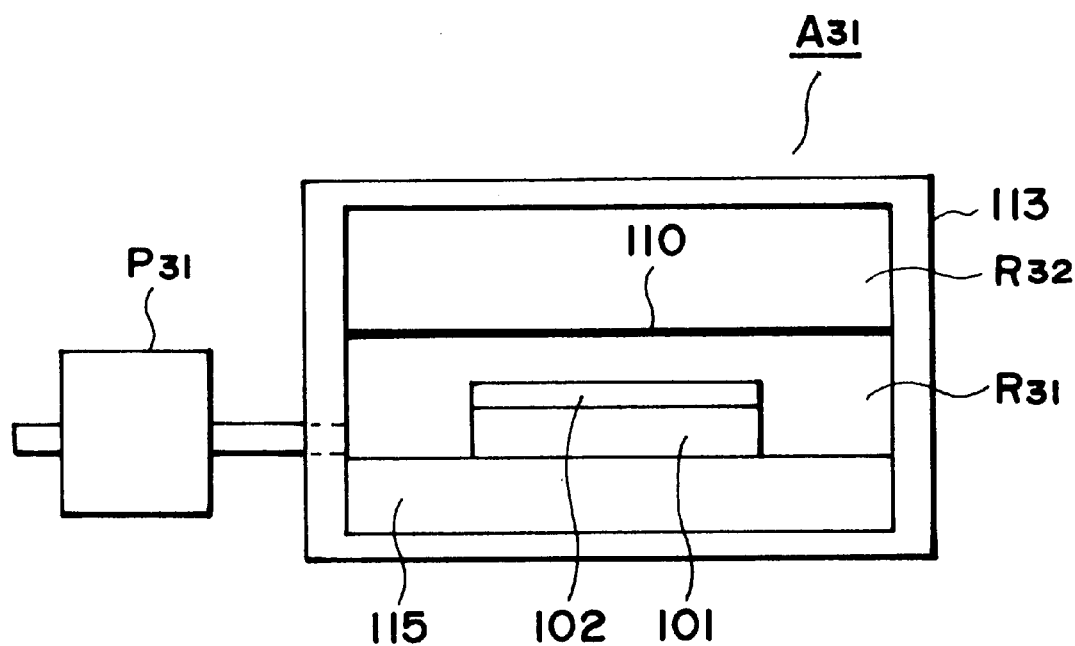
Figure 10B:
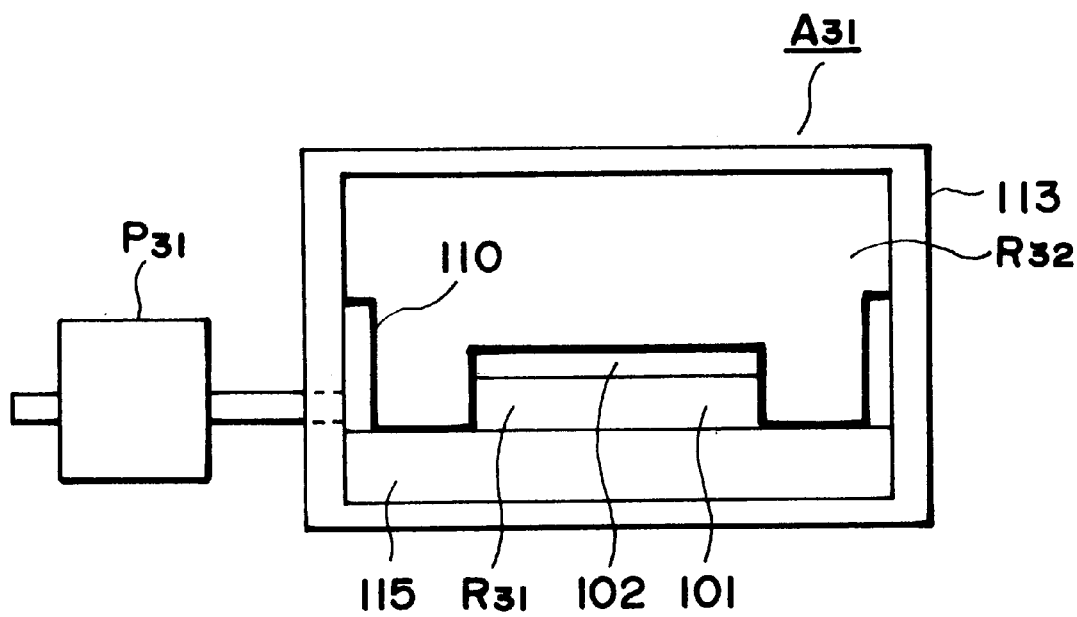

The apparatus $A_{31}$ (FIGS. 10A and 10B) includes a pressing means $P_{31}$ (e.g., evacuation means such as vacuum pump) connected to the lower chamber $R_{31}$, thus developing a differential pressure between the chambers $R_{31}$ and $R_{32}$ to effect the bonding (FIG. 10B).

The apparatus $A_{31}$ (FIGS. 11A and 11B) includes a pressing means $P_{32}$ (e.g., a high-pressure feeding means such as a pump) connected to the upper chamber $R_{32}$, thus developing a differential pressure between the chambers $R_{31}$ and $R_{32}$ to effect the bonding (FIG. 11B).

Figure 12:
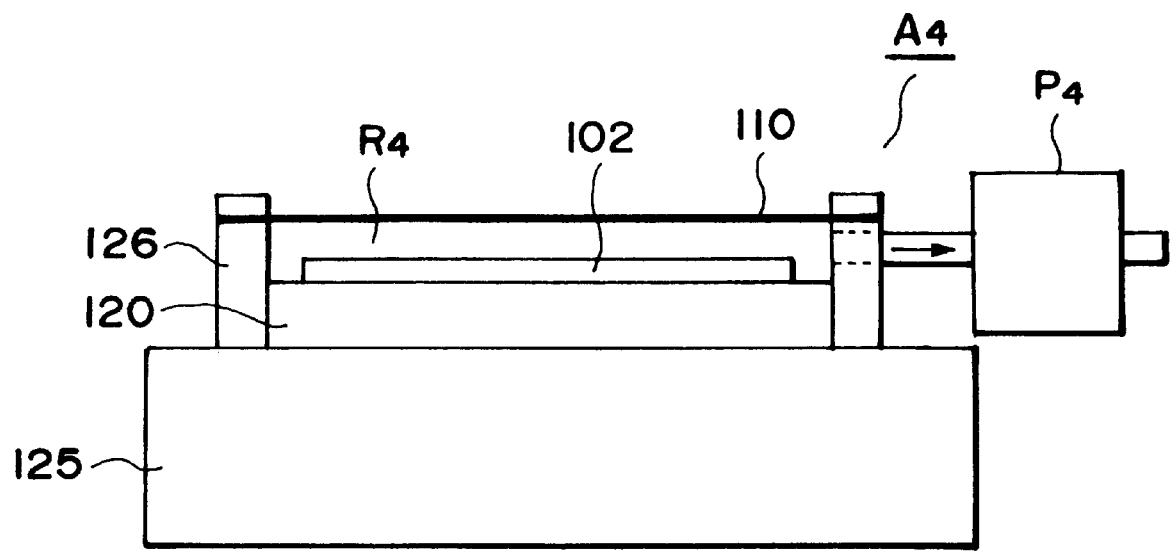

An anisotropic conductive film-bonding apparatus $A_4$ shown in FIG. 12 includes: a closed space $R_4$ enclosed by a flexible member 110 (e.g., a rubber sheet), a frame member 126 disposed on a stage 125, and a substrate 120 having thereon the anisotropic conductive film 102; and a pressing means $P_4$ (e.g., a vacuum pump) for evacuating air within the closed space to the outside.

The anisotropic conductive film 102 used in this embodiment may comprise a material identical to that of the anisotropic conductive layer 12 used in the above-described First Embodiment and formed in a prescribed thickness in the same manner as in the anisotropic conductive layer 12.

Then, a bonding method using the anisotropic conductive film-bonding apparatus of this embodiment will be explained.

An anisotropic conductive film 102 disposed on a substrate 101 is set in the above-mentioned anisotropic conductive film-bonding apparatus ($A_1$, $A_2$ $A_{31}$, $A_{32}$, $A_4$). In this state, when the apparatus is actuated, the pressing means ($P_1$, $P_2$, $P_{31}$, $P_{32}$, $P_4$) develops a differential pressure resulting from a difference in atmospheric pressure between the surface D contacting the substrate 101 and the surface V not contacting the substrate with respect to the anisotropic conductive film 102 against the substrate 101. In this state, heating is performed, whereby the anisotropic conductive film 102 is melted and bonded to the substrate 101.

According to this embodiment, it is not necessary to employ an expensive conventional heating (and pressing) tool for the bonding of the anisotropic conductive film, thus reducing equipment and production costs therefor. This is particularly noticeable in the case of bonding a large-sized anisotropic conductive film.

The use of the anisotropic conductive film-bonding apparatus of this embodiment allows a uniform bonding based on a differential pressure when compared with the conventional heating tool, thus ensuring uniform bonding of the anisotropic conductive film to the substrate.

Further, even when an anisotropic conductive film having an ununiform thickness is used for bonding electrical elements having electrodes different in thickness, it is possible to uniformly pressing and bonding the anisotropic conductive film onto the substrate.

The apparatus using the gas-feeding means supplying high-pressure gas to the closed space can be controlled to set a pressing force applied to the anisotropic conductive film within a relatively wider range, thus allowing a latitude in material selection for the anisotropic conductive film.

In the case of using the air-permeable material 111, air between the anisotropic conductive film 102 and the wall defining the closed space is effectively evacuated through the air-permeable member 111, thus permitting the pressing operation in a state not leaving air. As a result, the anisotropic conductive film 102 is uniformly bonded to the substrate 101.

By using the anisotropic conductive film-bonding apparatus of this embodiment for producing the multi-element module and the liquid crystal display device, it is possible to provide a multi-element module and a liquid crystal display device each excellent in adhesive qualities.

Hereinbelow, this embodiment (Second Embodiment) will be described more specifically based on some specific preferred examples.

As a first specific example, a 8 μm-thick anisotropic conductive film 102 is bonded to a substrate 101 by using an anisotropic conductive film-bonding apparatus $A_1$ as shown in FIG. 8.

The anisotropic conductive film 102 is prepared by uniformly dispersing 5 μmφ-epoxy resin particles (electroconductive particles) surface-coated with Ni—Au alloy in a mixture of 30 wt. parts of acrylic rubber, 60 wt. parts of epoxy resin, 9.5 wt. parts of polyvinyl phenol, 0.5 wt. part of undecyl imidazole resin and 100 wt. parts of MEK at a dispersion density of $10^6$ (particles)/mm$^3$ and applying the dispersion onto release paper, followed by drying to obtain a 8 μm-thick film.

The bonding apparatus shown in FIG. 8 includes a closed space $R_1$ enclosed by a flexible tube member 112 of a polyester film, and a pressing means $P_1$ of a vacuum pump connected to the closed space $R_1$ via an opening portion 112a of the flexible tube member 8.

The apparatus further includes an air-permeable member 111 of nonwoven fabric disposed within the closed space $R_1$ so as to enclose the anisotropic conductive film 102 and the substrate 101.

For bonding, on the substrate 101, the anisotropic conductive film 102 is disposed and, these members 101 and 102 are enclosed by the air-permeable member 111 and put in the flexible tube member 112 via the opening portion 112a.

The opening portion 112a is connected to the vacuum pump (pressing means) $P_1$, followed by actuating the vacuum pump $P_1$, thus evacuating air within the closed space $R_1$ to cause the flexible tube member 112 to closely contact the anisotropic conductive film 102 and the substrate 101 via the air-permeable member 111.

In that case, if the air-permeable member is not used, the flexible tube member 112 is insufficiently attached to the anisotropic conductive film 102 and the substrate 101 while partially leaving air therebetween, thus resulting in an inferior adhesion state between the anisotropic conducive film 102 and the substrate 101. As a result, a uniform pressing state over the entire bonding area cannot be attained.

In this example, by disposing the air-permeable member 111 between the anisotropic conductive film 102 (and the substrate 101) and the flexible tube member 112, air present therebetween is efficiently evacuated along the air-permeable member 111 (i.e., along the surface of the anisotropic conductive film 102), thus little leaving air therebetween. As a result, the anisotropic conductive film 102 is placed in a state such that it is pressed against the substrate 101 by uniform atmospheric pressure outside the flexible tube member 112.

Thereafter, the anisotropic conductive film 102 pressed against the substrate 101 in that state is heated and melted for several sec at ca. 80° C. in an oven, thus bonding the anisotropic conductive film 102 to the substrate 101.

As a second specific example, an anisotropic conductive film 102 (the same as in the first specific example) is bonded to a substrate 101 by using an anisotropic conductive film-bonding apparatus $A_{31}$ as shown in FIGS. 10A and 10B.

The bonding apparatus included an inflexible wall member 113 (vacuum laminator as a closed vessel) wherein a closed (inner) space is divided into an upper chamber $R_{32}$ and a lower chamber $R_{31}$ by a flexible member (a rubber sheet or film) 110, and a vacuum pump $P_{31}$ (as a pressing means) connected to the lower chamber $R_{31}$ for evacuating air therefrom.

In the lower chamber $R_{31}$, the anisotropic conductive film 102 disposed on the substrate 101 is mounted on a heating block 115 so that the anisotropic conductive film 102 is disposed opposite to the rubber sheet 110.

For bonding, the vacuum pump $P_{31}$ is actuated to place the lower chamber $R_{31}$ in a reduced-pressure state, whereby the rubber sheet 110 is attached to the anisotropic conductive film 102 as shown in FIG. 10B. As a result, the anisotropic conductive film 102 is pressed against the substrate 101 uniformly due to a differential pressure between the upper and lower chambers $R_{32}$ and $R_{31}$.

Thereafter, the heating block is actuated to heat the substrate 101 and the anisotropic conductive film 102 to bond the anisotropic conductive film 102 to the substrate 101.

When the bonding apparatus is modified so that the upper chamber $R_{32}$ communicated with ambient air, a similar bonding performance can be attained.

Figure 13:
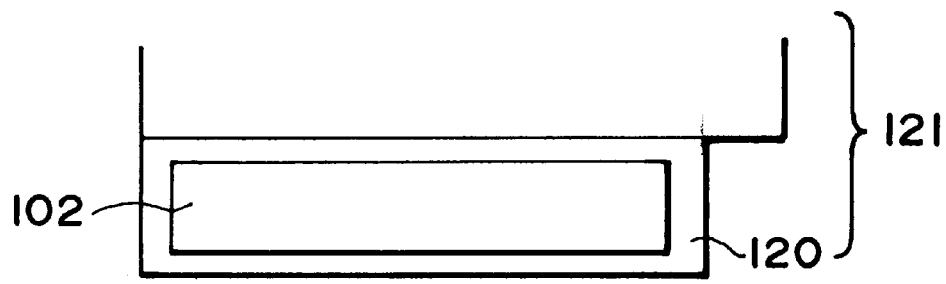
FIG. 13 is a schematic plan view of a part of a liquid crystal display apparatus including a substrate to which an anisotropic conductive film is bonded by using the apparatus shown in FIG. 12.
Figure 14:
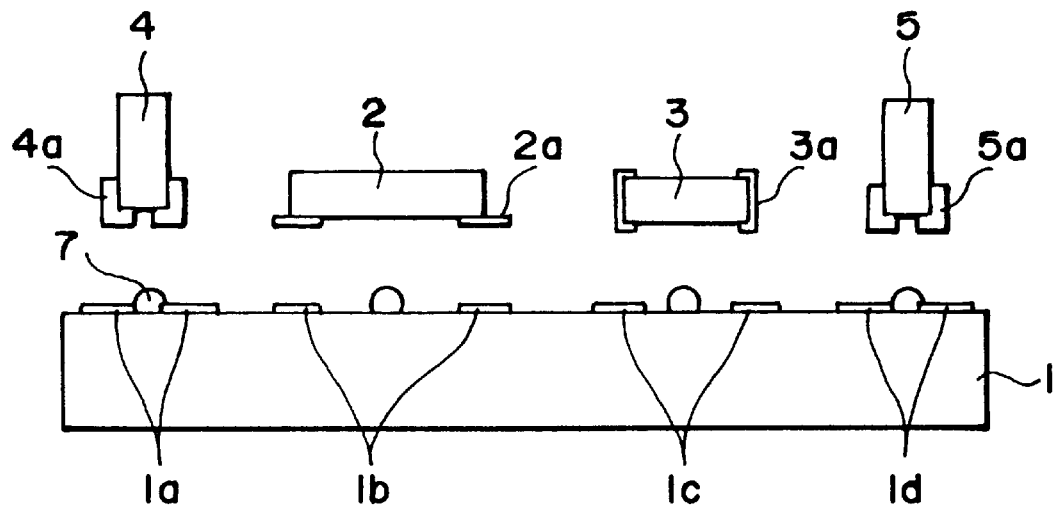
FIGS. 14 and 15 are schematic sectional view each for illustrating a conventional bonding method of electrical elements.

As a third specific example, an anisotropic conductive film 102 (the same as in the first specific example) is bonded to a glass substrate 120 constituting a liquid crystal display device 121 as shown in FIG. 13 by using an anisotropic conductive film-bonding apparatus $A_4$ as shown in FIG. 12.

The bonding apparatus $A_4$ includes a stage 125 containing therein a heating block (not shown in FIG. 12) on which a flexible frame member 126 (rubber member) is disposed so as to enclose the glass substrate 12 having thereon the anisotropic conductive film 102. Over the anisotropic conductive film 102, a rubber sheet 110 provided to the frame member 126 was disposed so as to define a closed space $R_4$ together with the frame member 126 and the stage 125. The closed space $R_4$ communicates with a vacuum pump $P_4$ (as a pressing means) through the frame member 126.

When the vacuum pump $P_4$ is actuated, air within the closed space $R_4$ is evacuated, thereby to cause the rubber sheet 110 to attach to the anisotropic conductive film 102. As a result, the anisotropic conductive film 102 is pressed against the glass substrate 120, followed by heating by means of the heating block to bond the anisotropic conductive film 102 to the glass substrate 120 for the liquid crystal display device 121.

As a fourth specific example, an anisotropic conductive film 102 (the same as in the first specific example) was bonded to a substrate 101 by using an anisotropic conductive film-bonding apparatus $A_2$ as shown in FIG. 9.

The bonding apparatus $A_2$ includes an inflexible (rigid) closed vessel 130 defining a closed space $R_2$ and including therein a heating block 131 (heating means) on which the anisotropic conductive film 102 disposed on the substrate 101 is mounted. A part of the closed vessel 130 is connected to a pump $P_2$ (pressure-feeding (supplying) means as a pressing means) for supplying high-pressure air to the closed space $R_2$.

When the pump $P_2$ is actuated, high-pressure air was introduced into the closed space $R_2$ to cause a differential pressure between a substrate-contacting surface D and a substrate-noncontacting surface V of the anisotropic conductive film 102, thereby placing the substrate-noncontacting side of the anisotropic conductive film 102 in a higher-pressure state. As a result, the anisotropic conductive film 102 is pressed on the substrate 101.

In that state, by heating the anisotropic conductive film 102 with the heating block 131, the anisotropic conductive film 102 is bonded to the substrate 101.

Third Embodiment

According to the third aspect of the present invention, there is provided an adhesive member and a multi-element module and a bonding method using the adhesive member. The adhesive member may be identical to that used in First Embodiment described above except for employing an adhesive layer 11 having an adhesiveness (adhesive properties) at room temperature (e.g., 15–30° C.).

The adhesive layer 11 used in this embodiment may comprises a layer of a polymer or resin showing a flowability at room temperature before curing, thus allowing bonding of the electrical elements 2–5 to the layer only under pressure (i.e., without heating). Examples of such a polymer (resin) may include styrene-butadiene rubbers (SBR), natural rubbers, polybutyl acrylates and so-called pressuresensitive adhesives (e.g., silicone resins or synthesis rubbers blended with an adhesiveness-imparting agent and an optional additive (plasticizer or antioxidant) as desired).

In a specific example, the adhesive layer 11 having room-temperature adhesive properties may preferably be prepared by applying a solution of 100 wt. parts of a styrene-butadiene block copolymer ("Tafuburen A", mfd. by Asahi Kasei Kogyo K. K.) and 50 wt. parts of an aromatic adhesiveness-imparting agent ("Petrozin #150", mfd. by Mitsui Sekiyu Kagaku K. K.) in 200 wt. parts of toluene onto a separating film (a polyester film surface-treated with a releasing agent) in a prescribed thickness by means of a hot-melt coater, followed by drying (e.g., for 3 min. at 120° C.) to obtain a film (adhesive layer) in a prescribed thickness (e.g., 12 $\mu$m, 22 $\mu$m or 147 $\mu$m).

The adhesive layer used in this embodiment, similarly as in First Embodiment, may be formed in a substantially uniform thickness (FIGS. 2 and 16), a partial two-layer structure (FIG. 3A and 3B), and a discrete form (including no adhesive layer portion) (FIG. 4A and 4B) as specifically described above. The layer between the anisotropic conductive layer 12 and an upper adhesive layer may be comprised of a room-temperature adhesive resin or other materials (resins or polymers) having no adhesiveness at room temperature. It is also possible to further dispose an intermediate layer between the anisotropic conductive layer 12 and the adhesive layer(s).

A multi-element module using the above-mentioned adhesive member 10 may be prepared in the same manner as in First Embodiment.

A bonding method using the adhesive member 10 will be described.

The anisotropic conducive layer 12 is disposed so as to cover the electrodes 1a–1d on the substrate side and the adhesive layer 11 is disposed so as to cover the anisotropic conductive layer 12 or the electrodes 2a–5a on the electrical element side.

Then, the electrical elements 2–5 are superposed on the substrate 1 so that the electrodes 4a, 2a, 3a and 5a are aligned with the electrodes 1a, 1b, 1c and 1d, respectively, in an opposed relationship, thus effecting (preliminary) bonding of the electrical elements 2–5 to the substrate 1.

After the superposition, respectively bonding (adhesive) points of the electrical elements 2–5 and the substrate 1 are pressed and heated to complete the bonding operation.

According to this embodiment, is addition to the effects attained in First Embodiment, the following advantages are obtained.

The adhesive layer 11 has room-temperature adhesive properties, so that the mounting (preliminary bonding) of the electrical elements 2–5 on the substrate 1 can readily be performed only by applying a pressure, thus rendering a heating operation unnecessary. Accordingly, it is possible to effect the preliminary bonding without employing a special mounter having a heating function, i.e., by using an inexpensive apparatus (equipment) such as a mounter for solding, thus suppressing an increase in production costs. Further, it is unnecessary to keep the electrical elements 2–5 until the adhesive layer 10 is heated up to a prescribed temperature (e.g., 80±10° C.), thus reducing a time for the preliminary bonding to ca. 0.1–0.3 sec comparable to the case of the soldering. In addition, a lowering in positioning accuracy due to the heating can be avoided. Further, the heating-less preliminary bonding allows a reduction of a time therefor and improves a productivity.

What is claimed is:

1. A multi-element module, comprising:

a substrate having thereon a plurality of first electrodes, a plurality of electrical elements each having at least one second electrode and disposed so that its second electrode is aligned paired with a first electrode in an opposed relationship, and an adhesive member disposed between the substrate and the plurality of electrical elements, wherein the adhesive member has a laminated form including an anisotropic conductive layer contacting the first electrodes and an adhesive layer contacting the second electrodes, the anisotropic conductive layer comprises a resin and electroconductive particles dispersed in the resin whereby the first electrode and the second electrode aligned in a pair are electrically connected to each other and isolated from the other pairs of first and second electrodes, and the adhesive layer has a larger adhesive force than the anisotropic conductive layer and enhances the adhesion between the plurality of electrical elements and the substrate via the anisotropic conductive layer while ensuring the electrical connection between the first and second electrodes.

2. A module according to claim 1, wherein when the second electrodes of the electrical elements have different thicknesses at respective bonding points thereof, the adhesive member has a thickness equal to or larger than the thickness of the second electrodes at the bonding points.

3. A module according to claim 2, wherein the adhesive member is disposed on the entire surface of the substrate in a substantially uniform thickness equal to or larger than a maximum thickness of the second electrodes.

4. A module according to any one of claims 1–3, wherein the substrate comprises a component of a liquid crystal display panel.

5. A module according to claim 4, where the component comprises a glass substrate.

6. A process for producing a multi-element module including a substrate having thereon first electrodes, and electrical elements having second electrodes and bonded to the substrate via an adhesive layer and an anisotropic conductive layer while retaining electrical connection between the first and second electrodes disposed opposite to each other; said process comprising:

applying an adhesive layer for effecting bonding between the substrate and the electrical elements onto the electrical elements, applying onto the substrate an anisotropic conductive layer for insulating adjacent first electrodes from each other while electrically connecting the first and second electrodes, and superposing the adhesive layer on the anisotropic conductive layer so as to contact each other, the adhesive layer having a larger adhesive force than the anisotropic conductive layer so as to enhance the adhesion between the plurality of electrical elements and the substrate via the anisotropic conductive layer.

7. A process for producing a multi-element module including a substrate having thereon first electrodes, and electrical elements having second electrodes and bonded to the substrate via an adhesive member comprising an adhesive layer and an anisotropic conductive layer while retaining electrical connection between the first and second electrodes disposed opposite to each other; said process comprising:

bonding an adhesive member, which comprises an adhesive layer for bonding the substrate and the electrical elements to each other and an anisotropic conductive layer in lamination, to the substrate so that the anisotropic conductive layer contacts the substrate, and bonding the electrical elements to the adhesive layer having a larger adhesive force than the anisotropic conductive layer so as to enhance the adhesion between the plurality of electrical elements and the substrate via the anisotropic conductive layer.

8. A process according to claim 6 or 7, wherein the anisotropic conductive layer comprises a resin and electroconductive particles dispersed in the resin.

9. An anisotropic conductive film-bonding apparatus for bonding to a substrate an anisotropic conductive film having two opposing surfaces and providing electroconductive properties in its thickness direction and insulating properties in its planar direction, comprising:

a closed space for receiving said substrate bearing one of said two opposing surfaces of said anisotropic film, and a press which developes a differential pressure resulting from a difference in atmospheric pressure between one of the opposite surface contacting the substrate within the closed space and the other surface of the anisotropic conductive film so as to press the anisotropic conductive film on the substrate, the press comprising gas-feeding means for supplying high-pressure gas to the closed space, wherein the surface not contacting the substrate of the anisotropic conductive film is supplied with a pressure higher than that at the surface contacting the substrate of the anisotropic conductive film.

10. An anisotropic conductive film-bonding apparatus for bonding to a substrate an anisotropic conductive film having two opposing surfaces and providing electroconductive properties in its thickness direction and insulating properties in its planar direction, comprising:

a closed space for receiving said substrate bearing one of said two opposing surfaces of said anisotropic film, wherein the closed space is divided by a flexible member into two chambers including a chamber in which the anisotropic conductive film disposed on the substrate is disposed opposite to the flexible member, and a press which develops a differential pressure in the two chambers resulting from a difference in atmospheric pressure between one of the opposite surface contacting the substrate within the closed space and the other surface of the anisotropic conductive film so as to press the anisotropic conductive film on the substrate.

11. An apparatus according to claim 10, wherein the pressing means is connected and supplies high-pressure gas to the chamber in which the anisotropic conductive film is not disposed.

12. An apparatus according to claim 11, wherein the closed space is enclosed by a wall member comprising an inflexible member.

13. An apparatus according to claim 10, wherein the pressing means comprises evacuation means connected to the chamber in which the anisotropic conductive film is disposed and from which air is evacuated.

14. An apparatus according to claim 13, wherein the closed space is enclosed by a wall member comprising an inflexible member.

15. An apparatus according to claim 9, wherein the closed space is enclosed by a flexible tube member and is connected to the pressing means by which air within the closed space is evacuated.

16. An apparatus according to claim 15, wherein the flexible tube member comprises a resin film.

17. An apparatus according to claim 16, wherein the resin film is a polyester film.

18. An apparatus according to claim 15, which further includes an air-permeable member disposed at least between the anisotropic conductive film and the flexible tube member and air between the anisotropic conductive film and the flexible tube member is evacuated through the air-permeable member.

19. An apparatus according to claim 18, wherein the air-permeable member comprises a nonwoven fabric.

20. An apparatus according to claim 9, wherein the pressing means comprises a vacuum pump.

21. An apparatus according to claim 9, wherein the anisotropic conductive film comprises a resin layer and electroconductive particles dispersed in the resin layer.

22. An apparatus according to claim 9, wherein the closed space is enclosed by a wall member a part of which includes a flexible member disposed opposite to the anisotropic conductive film disposed on the substrate.

23. An apparatus according to claim 22, wherein the substrate is provided with heating means.

24. An apparatus according to claim 9, which further includes heating means for heating the anisotropic conductive film disposed on the substrate.

25. An apparatus according to claim 24, wherein the heating means is provided to the substrate.

26. An apparatus according to any one of claims 9–25, wherein the substrates comprises a component of a liquid crystal display panel.

27. An apparatus according to claim 26, wherein the component comprises a glass substrate.

28. An adhesive member for bonding a first electrical component provided with first electrodes to a second electrical component provided with second electrodes disposed opposite to the first electrodes, comprising:

an adhesive layer having room-temperature adhesive properties for bonding first and second electrical components to each other disposed on an anisotropic conductive layer comprising a resin and electroconductive particles dispersed in the resin for ensuring electrical connection between opposite first and second electrodes while retaining electrical insulation between adjacent electrodes, the adhesive layer having a larger adhesive force than the anisotropic conductive layer so as to enhance the adhesion between the plurality of electrical elements and the substrate via the anisotropic conductive layer.

29. A member according to claim 28, wherein the adhesive layer comprises a layer of a polymer having a room temperature flowability.

30. A multi-element module, comprising:

a substrate having thereon a plurality of first electrodes, a plurality of electrical elements each having at least one second electrode and disposed so that its second electrode is aligned paired with a first electrode in an opposed relationship, and an adhesive member disposed between the substrate and the plurality of electrical elements, wherein the adhesive member has a laminated form including an anisotropic conductive layer contacting the second electrodes, the anisotropic conductive layer comprises a resin and electroconductive particles dispersed in the resin whereby the first electrode and the second electrode aligned in a pair are electrically connected with each other and isolated from the other pairs of first and second electrodes, and the adhesive layer has a larger adhesive force than the anisotropic conductive layer at room-temperature and enhances the adhesion between the plurality of electrical elements and the substrate via the anisotropic conductive layer while ensuring the electrical connection between the first and second electrodes.

31. A module according to claim 30, wherein the adhesive layer comprises a layer of a polymer having a room-temperature flowability.

32. A module according to claim 30 or 31, wherein when the second electrodes of the electrical elements have different thicknesses at respective bonding points thereof, the adhesive member has a thickness equal to or larger than the thickness of the second electrodes at the bonding points.

33. A module according to claim 32, wherein the adhesive member is disposed on the entire surface of the substrate in a substantially uniform thickness equal to or larger than a maximum thickness of the second electrodes.

34. A module according to claim 30, wherein the substrate comprises a component of a liquid crystal display panel.

35. A module according to claim 34, where the component comprises a glass substrate.

36. A bonding method for bonding a substrate provided with first electrodes and electrical elements provided with second electrodes to each other so that the first electrodes and the second electrodes are disposed opposite to each other, said method comprising:

disposing an anisotropic conductive layer on the substrate so as to cover the first electrodes and electrically connect opposite first and second electrodes with each other while insulating adjacent electrodes from each other, disposing an adhesive layer having room-temperature adhesive properties on the anisotropic conductive layer or the second electrodes provided to the electrical elements, superposing the electrical elements on the substrate so that the second electrodes are aligned with the first electrodes in an opposed relationship, and heating and pressing the electrical elements and the substrate at bonding points therebetween, the adhesive layer having a larger adhesive force than the anisotropic conductive layer so as to enhance the adhesion between the plurality of electrical elements and the substrate via the anisotropic conductive layer.

37. A method according to claim 36, wherein the anisotropic conductive layer comprises a resin and electroconductive particles dispersed in the resin.

* * * * *

UNITED STATES PATENT AND TRADEMARK OFFICE
CERTIFICATE OF CORRECTION

PATENT NO.    : 6,172,878 B1
DATED         : January 9, 2001
INVENTOR(S)   : Hiroshi Takabayashi et al.

It is certified that error appears in the above-identified patent and that said Letters Patent is hereby corrected as shown below:

<u>Title page,</u>
Item [57], ABSTRACT,
Line 15, "connects" should read -- connecting --.

<u>Column 1,</u>
Line 26, "includes" should read -- which includes --; and
Line 38, "electrodes" should read -- electrode --.

<u>Column 3,</u>
Line 60, "tables" should read -- takes --.

<u>Column 4,</u>
Line 29, "electrodes is" should read -- electrodes are --; and
Line 64, "connects" should read -- connecting --.

<u>Column 5,</u>
Line 11, "connects" should read -- connecting --; and
Line 39, "disposed" should read -- are disposed --.

<u>Column 6,</u>
Line 28, "connects" should read -- connecting --;
Line 39, "insulates" should read -- insulating --;
Line 57, "view" should read -- view of --;
Line 63, "a" should be deleted;
Line 64, "view" should read -- views --; and
Line 67, "adhesive-member" should read -- adhesive member --.

<u>Column 7,</u>
Line 20, "view" should read -- views --; and
Line 39, "comprise" should read -- comprises --.

<u>Column 8,</u>
Line 4, "1b and 1c," (first occurrence) should be deleted; and
Line 36, "element" should read -- elements --.

UNITED STATES PATENT AND TRADEMARK OFFICE
CERTIFICATE OF CORRECTION

PATENT NO. : 6,172,878 B1
DATED : January 9, 2001
INVENTOR(S) : Hiroshi Takabayashi et al.

It is certified that error appears in the above-identified patent and that said Letters Patent is hereby corrected as shown below:

Column 9,
Line 22, "boning" should read -- bonding --; and
Line 51, "compatible provide" should be deleted.

Column 10,
Line 8, "by" should read -- be --;
Line 9, "a 8" should read -- an 8 --;
Line 29, "a 8" should read -- an 8 --;
Line 51, "an" should read -- and --; and
Line 62, "is prepared" should be deleted.

Column 12,
Line 2, "element" should read -- elements --;
Line 7, "element" should read -- elements --;
Line 34, "a 8" should read -- an 8 --; and
Line 36, "occur" should read -- provide --.

Column 13,
Line 21, "illustrates" should read -- illustrate --;
Line 22, "conducive" should read -- conductive --; and
Line 46, "and" (second occurrence) should read -- are --.

Column 14,
Line 9, "$A_2$" should read -- $A_2$, --;
Line 32, "pressing" should read -- press --; and "bonding" should read -- bond --;
Line 55, "a 8" should read -- an 8 --; and
Line 67, "a 8" should read -- an 8 --.

Column 15,
Line 24, "conducive" should read -- conductive --; and
Line 32, "little leaving" should read -- leaving little --.

Column 16,
Line 2, "communicated" should read -- communicates --;
Line 56, "first" should read -- the first --; and
Line 62, "comprises" should read -- comprise --.

UNITED STATES PATENT AND TRADEMARK OFFICE
CERTIFICATE OF CORRECTION

PATENT NO. : 6,172,878 B1
DATED : January 9, 2001
INVENTOR(S) : Hiroshi Takabayashi et al.

It is certified that error appears in the above-identified patent and that said Letters Patent is hereby corrected as shown below:

Column 17,
Line 17, "first" should read -- the first --;
Line 30, "first" should read -- the first --;
Line 34, "conducive" should read -- conductive --;
Line 47, "is" should read -- in --;
Line 48, "first" should read -- the first --.
Line 59, "solding" should read -- soldering, --; and
Line 67, "a" should be deleted.

Column 18,
Line 37, "where" should read -- wherein --.

Column 19,
Line 20, "developes" should read -- develops --.

Column 20,
Line 30, "substrates" should read -- substrate --.

Column 21,
Line 24, "where" should read -- wherein --.

Signed and Sealed this

Thirtieth Day of July, 2002

Attest:

JAMES E. ROGAN
Attesting Officer
Director of the United States Patent and Trademark Office